(12) United States Patent
Wall et al.

(10) Patent No.: US 8,114,339 B2
(45) Date of Patent: Feb. 14, 2012

(54) METHOD OF AND APPARATUS UTILIZING CARBON CORD FOR EVAPORATION OF METALS

(75) Inventors: Arthur C. Wall, Morgan Hill, CA (US); Terry Bluck, Santa Clara, CA (US)

(73) Assignee: Intevac, Inc., Santa Clara, CA (US)

( * ) Notice: Subject to any disclaimer, the term of this patent is extended or adjusted under 35 U.S.C. 154(b) by 79 days.

(21) Appl. No.: 12/712,043

(22) Filed: Feb. 24, 2010

(65) Prior Publication Data

US 2011/0206865 A1    Aug. 25, 2011

(51) Int. Cl.
*F27B 14/10*     (2006.01)
*F27B 14/14*     (2006.01)

(52) U.S. Cl. ...................... 266/275; 432/262

(58) Field of Classification Search .............. 432/262; 266/275

See application file for complete search history.

(56) References Cited

U.S. PATENT DOCUMENTS

| 4,062,679 A | 12/1977 | Marsh et al. |
| 4,732,620 A | 3/1988 | Hunold et al. |
| 4,989,218 A * | 1/1991 | Tateno ................ 373/145 |
| 6,893,992 B2 * | 5/2005 | Doza et al. ............ 501/95.1 |

* cited by examiner

*Primary Examiner* — George Wyszomierski
*Assistant Examiner* — Tima M McGuthry Banks
(74) *Attorney, Agent, or Firm* — Nixon Peabody LLP; Joseph Bach, Esq.

(57) ABSTRACT

A high temperature evaporator is made using an electrically insulating crucible and a heating element made of woven graphite fibers. The crucible is manufactured out of an electrically insulating block to the required shape, and channels are machined on the walls of the crucible. The woven graphite cord is threaded through the channels and is used as heating elements. Since the heating cords are made of woven graphite, they are very flexible and do not embrittle. They can be manufactured to various resistivity as needed, allowing for relatively inexpensive power supplies and low current power delivery. The cords are not fragile and do not break due to thermal shock or vibration.

14 Claims, 1 Drawing Sheet

METHOD OF AND APPARATUS UTILIZING CARBON CORD FOR EVAPORATION OF METALS

FIELD OF THE INVENTION

The present invention relates generally to a method of and apparatus utilizing carbon cord for the evaporation of metals.

BACKGROUND ART

Certain manufacturing processes require heating and evaporating metals. For example, deposition of thin film of copper may be performed by evaporating copper at temperatures of 1300° C.-1600° C. These high temperatures are needed in order to achieve sufficiently high vapor pressure to enable commercially acceptable deposition rates. However, these high temperatures also drive taxing requirements on the crucibles used for the evaporation. Such crucibles are therefore generally made from refractory materials.

Typically BCC (body centered cubic) refractory metals (e.g., tungsten and tantalum) are used as heating elements. However, these materials have several significant drawbacks. In addition to being expensive, they become very brittle at high temperatures, leading to premature failure. Moreover, while bcc metals have relatively low resistivity at room temperature, their resistivity increases at high temperature, thereby placing stringent requirements on the power supplier design and costs.

Graphite rods and machined graphite elements have also been used as heating elements for evaporators. Such elements typically have low resistivity, thereby requiring high currents at low voltages, which also drives the power supply and delivery costs. While the resistivity of machined graphite elements can be increased, they are expensive, fragile, and difficult to machine into shapes which work with complex crucible geometry.

In view of the above, a solution is needed for a heating element and crucible arrangement having reduced costs, high reliability, and easy manufacturability.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In accordance with one aspect of the invention, a heating element is fabricated using woven graphite fibers. The crucible is manufactured out of an insulating material to the required shape, and channels are machined on the walls of the crucible. The woven graphite cords are threaded through the channels and are used as heating elements. Since the heating cords are made of woven graphite, they are very flexible and do not embrittle. They can be manufactured to various resistivity as needed, allowing for relatively inexpensive power supplies and low current power delivery. The cords are not fragile and do not break due to thermal shock or vibration.

The above and still further objects, features and advantages of the present invention will become apparent upon consideration of the following detailed description of a specific embodiment thereof, especially when taken in conjunction with the accompanying drawings.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figures 1A, 1B, 1C:
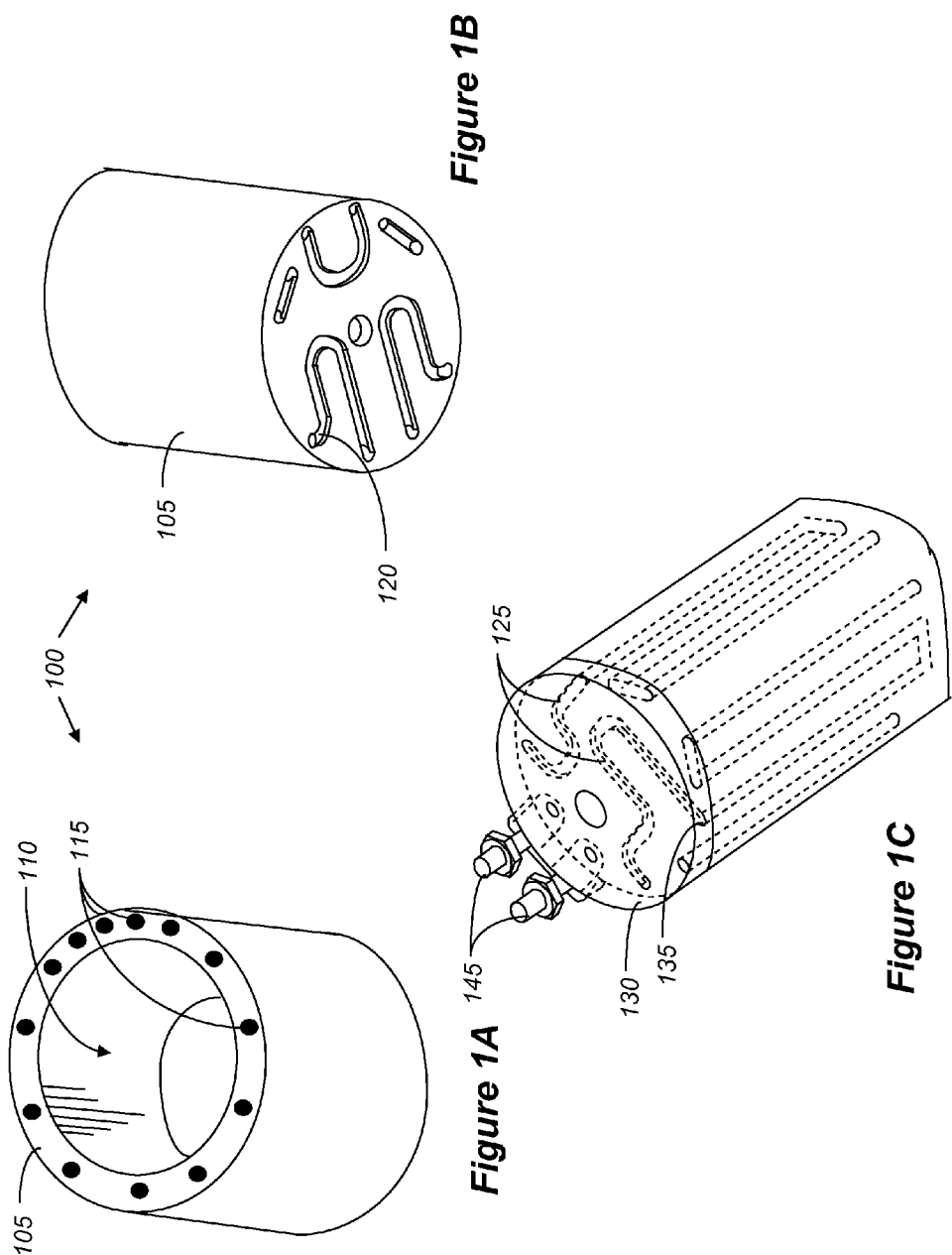
FIG. 1A is a top view of an embodiment of a crucible in accordance with the present invention.
FIG. 1B is a bottom view of an embodiment of a crucible in accordance with the present invention.
FIG. 1C is a partial side view of an embodiment of a crucible in accordance with the present invention.

Graphite cords are well known and are commercially available for various applications. For example, graphite cords reinforced with cotton or glass fibers for packaging and sealing applications are available from Flips India Engineering of Mumbai, India. Graphite cords are also available from Beijing Sanye Carbon Co., Ltd. Of Beijing, China. Such cords are generally woven and therefore are very flexible and can be manufactured to various specifications, especially specified resistivity. By selecting graphite cord of appropriate resistivity, the rods can be used as heating elements which require inexpensive power suppliers and relatively low current delivery, thereby low operating costs. For example, the use of graphite cords for heating elements enables the use of commercially available SCR (Silicon-controlled rectifier) line voltage power suppliers at low currents (e.g., below 20 Amperes).

Reference is now made to the drawings, wherein FIG. 1A is a top view of an embodiment of a crucible in accordance with the present invention; FIG. 1B is a bottom view of an embodiment of a crucible in accordance with the present invention; and FIG. 1C is a partial side view of an embodiment of a crucible in accordance with the present invention. Crucible 100 is made of electrically isolative material. For example, the can be machined out of a boron nitride blank. A main cavity 110 is made for placing the material to be evaporated. Channels 115 are machined through walls 105. Connecting channels 120 are provided on the bottom of the crucible, making pathways between the channels. Similar connecting holes 135 are provided on the top cover 130 of the crucible 100 The connecting holes are structured to mate with the channels 115. Connectors 145 are provided on the top cover 130 to provide connecting pathways between the holes.

As noted above, the graphite cord is very flexible, allowing threading of the cord via the channels 125, and connecting channels 120 and 125. The graphite cord is then connected to the electrical connectors 145. The electrical connectors 145 are then connected to a power supplier. Notably, when the heating element deteriorates or fails, a new graphite cord can be threaded, thereby reusing the machined crucible.

The process of making the evaporator includes fabricating a main body 100 out of electrically isolative material; fabricating the main cavity 110 in the main body 100, such that the main cavity 110 is surrounded by sidewalls 105; fabricating a plurality of channels 115 in the sidewalls 105; and threading a graphite cord through the channels 115. In the embodiments of FIGS. 1A-1C, the method also includes fabricating connecting channels 120 on bottom part of the main body, and threading the graphite cord through the connecting channels; fabricating a top 130 out of electrically isolating material; fabricating holes 135 in the top 130; and threading the graphite cord through the holes.

Further, according to aspects of the invention, method of evaporating metals, comprises providing a crucible made of electrically isolative material and having channels in sidewalls thereof; threading graphite cord through the channels; placing the metals in a cavity of the crucible; and coupling the graphite cord to a power supplier.

While there has been described and illustrated a specific embodiment of the invention, it will be clear that variations in the details of the embodiment specifically illustrated and described may be made without departing from the true spirit and scope of the invention as defined in the appended claims. It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A method for fabricating a high temperature evaporator, comprising:
    fabricating a main body out of electrically isolative material;
    fabricating a main cavity in the main body, such that the main cavity is surrounded by sidewalls;
    fabricating a plurality of channels in the sidewalls;
    threading a graphite cord through the channels; and,
    connecting the graphite cord to electrical connectors.

2. A method for fabricating a high temperature evaporator, comprising:
    fabricating a main body out of electrically isolative material;
    fabricating a main cavity in the main body, such that the main cavity is surrounded by sidewalls;
    fabricating a plurality of channels in the sidewalls;
    threading a graphite cord through the channels; and,
    fabricating connecting channels on bottom part of the main body, and threading the graphite cord through the connecting channels.

3. The method of claim 2 further comprising fabricating a top of electrically isolating material; fabricating holes in the top; and threading the graphite cord through the holes.

4. The method of claim 2, wherein fabricating a main body comprises fabricating a main body out of boron nitride.

5. The method of claim 2, further comprising connecting the graphite cord to electrical connectors.

6. A high temperature evaporator, comprising:
    a main body fabricated of electrically isolative material and having a main cavity surrounded by sidewalls, and a plurality of channels made in the sidewalls;
    a graphite cord threaded through the channels; and,
    electrical connectors wherein the graphite cord is connected to the electrical connectors.

7. The evaporator of claim 6 wherein the main body is made of boron nitride.

8. A high temperature evaporator, comprising:
    a main body fabricated of electrically isolative material and having a main cavity surrounded by sidewalls, and a plurality of channels made in the sidewalls;
    a graphite cord threaded through the channels; and,
    connecting channels on bottom section thereof, providing pathways between the channels.

9. The evaporator of claim 8 wherein the main body further comprises connecting channels on top cover section thereof, providing pathways between the channels.

10. The evaporator of claim 8, wherein the main body is made of boron nitride.

11. The evaporator of claim 8, further comprising electrical connectors and wherein the graphite cord is connected to the electrical connectors.

12. A crucible for a high temperature evaporator, comprising:
    a main body machined of electrically isolative material block and having a main cavity surrounded by sidewalls, and a plurality of channels made in the sidewalls, the channels configured for accepting graphite cord;
    a top made of electrically isolative material and having holes mating with the channels, the holes configured for accepting graphite cord.

13. The evaporator of claim 12, wherein the main body is made of boron nitride.

14. The evaporator of claim 12, further comprising electrical connectors and wherein the graphite cord is connected to the electrical connectors.

* * * * *